United States Patent
Lius et al.

(10) Patent No.: US 12,142,070 B2
(45) Date of Patent: Nov. 12, 2024

(54) ELECTRONIC DEVICE HAVING LIGHT-EMITTING UNIT AND PHOTOSENSOR

(71) Applicant: Innolux Corporation, Miaoli County (TW)

(72) Inventors: Chandra Lius, Miaoli County (TW); Kuan-Feng Lee, Miaoli County (TW); Tsung-Han Tsai, Miaoli County (TW); Chung-Wen Yen, Miaoli County (TW); Chiu-Lien Yang, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 0 days.

(21) Appl. No.: 17/984,252

(22) Filed: Nov. 10, 2022

(65) Prior Publication Data

US 2023/0186673 A1 Jun. 15, 2023

(30) Foreign Application Priority Data

Dec. 9, 2021 (CN) .......................... 202111500415.1

(51) Int. Cl.
*G06V 40/13* (2022.01)
*H01L 25/075* (2006.01)
*H01L 27/146* (2006.01)
*H01L 33/50* (2010.01)

(52) U.S. Cl.
CPC ...... *G06V 40/1318* (2022.01); *H01L 25/0753* (2013.01); *H01L 27/14678* (2013.01); *H01L 33/50* (2013.01)

(58) Field of Classification Search
CPC .............. G06K 9/0004; G06V 40/1318; H01L 27/3227; H01L 27/3234; H10K 59/60; H10K 59/65
See application file for complete search history.

(56) References Cited

U.S. PATENT DOCUMENTS

| | | | |
|---|---|---|---|
| 2018/0107054 A1* | 4/2018 | He | G02F 1/13394 |
| 2018/0293452 A1* | 10/2018 | Chung | H04N 23/55 |
| 2019/0198585 A1 | 6/2019 | Chang et al. | |
| 2021/0096678 A1* | 4/2021 | Kubota | G06F 3/042 |
| 2022/0067340 A1* | 3/2022 | Han | H10K 50/865 |
| 2022/0069034 A1* | 3/2022 | Yoo | H10K 59/38 |
| 2022/0173174 A1* | 6/2022 | Hatsumi | H10K 59/65 |
| 2022/0190061 A1* | 6/2022 | Baek | H10K 59/60 |

(Continued)

FOREIGN PATENT DOCUMENTS

TW 202105788 2/2021

OTHER PUBLICATIONS

"Office Action of Taiwan Counterpart Application", issued on May 25, 2023, p. 1-p. 3.

*Primary Examiner* — Yuzhen Shen
(74) *Attorney, Agent, or Firm* — JCIPRNET

(57) ABSTRACT

An electronic device includes a first substrate, a second substrate, a light-impermeable layer, a light-emitting unit, and a photosensor. The second substrate is opposite to the first substrate. The light-impermeable layer is disposed between the first substrate and the second substrate and includes a first opening and a second opening. The light-emitting unit is disposed between the first substrate and the second substrate and overlapped with the first opening. The photosensor is disposed on the first substrate and overlapped with the second opening.

15 Claims, 15 Drawing Sheets

(56) References Cited

U.S. PATENT DOCUMENTS

| | | | |
|---|---|---|---|
| 2022/0199694 A1* | 6/2022 | Bae | B29C 59/02 |
| 2022/0271103 A1* | 8/2022 | Hai | H10K 59/60 |
| 2022/0309267 A1* | 9/2022 | Kim | G06V 40/1318 |
| 2023/0116805 A1* | 4/2023 | Kim | H10K 65/00 |
| | | | 345/76 |

* cited by examiner

ELECTRONIC DEVICE HAVING LIGHT-EMITTING UNIT AND PHOTOSENSOR

CROSS-REFERENCE TO RELATED APPLICATION

This application claims the priority benefit of China application no. 202111500415.1, filed on Dec. 9, 2021. The entirety of the above-mentioned patent application is hereby incorporated by reference herein and made a part of this specification.

BACKGROUND

Technical Field

The disclosure relates to an electronic device, and more particularly, to an electronic device including a photosensor.

Description of Related Art

In order to provide the function of identity recognition (such as fingerprint sensing), existing electronic devices have an opening formed in the peripheral region thereof to accommodate a sensing module for identity recognition. However, this approach leads to a reduction in the screen-to-body ratio.

SUMMARY

The disclosure provides an electronic device helping to alleviate the issue of reduced screen-to-body ratio.

According to an embodiment of the disclosure, an electronic device includes a first substrate, a second substrate, a light-impermeable layer, a light-emitting unit, and a photosensor. The second substrate is opposite to the first substrate. The light-impermeable layer is disposed between the first substrate and the second substrate and includes a first opening and a second opening. The light-emitting unit is disposed between the first substrate and the second substrate and overlapped with the first opening. The photosensor is disposed on the first substrate and overlapped with the second opening.

In order to make the above features and advantages of the disclosure better understood, embodiments are specifically provided below with reference to figures for detailed description as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
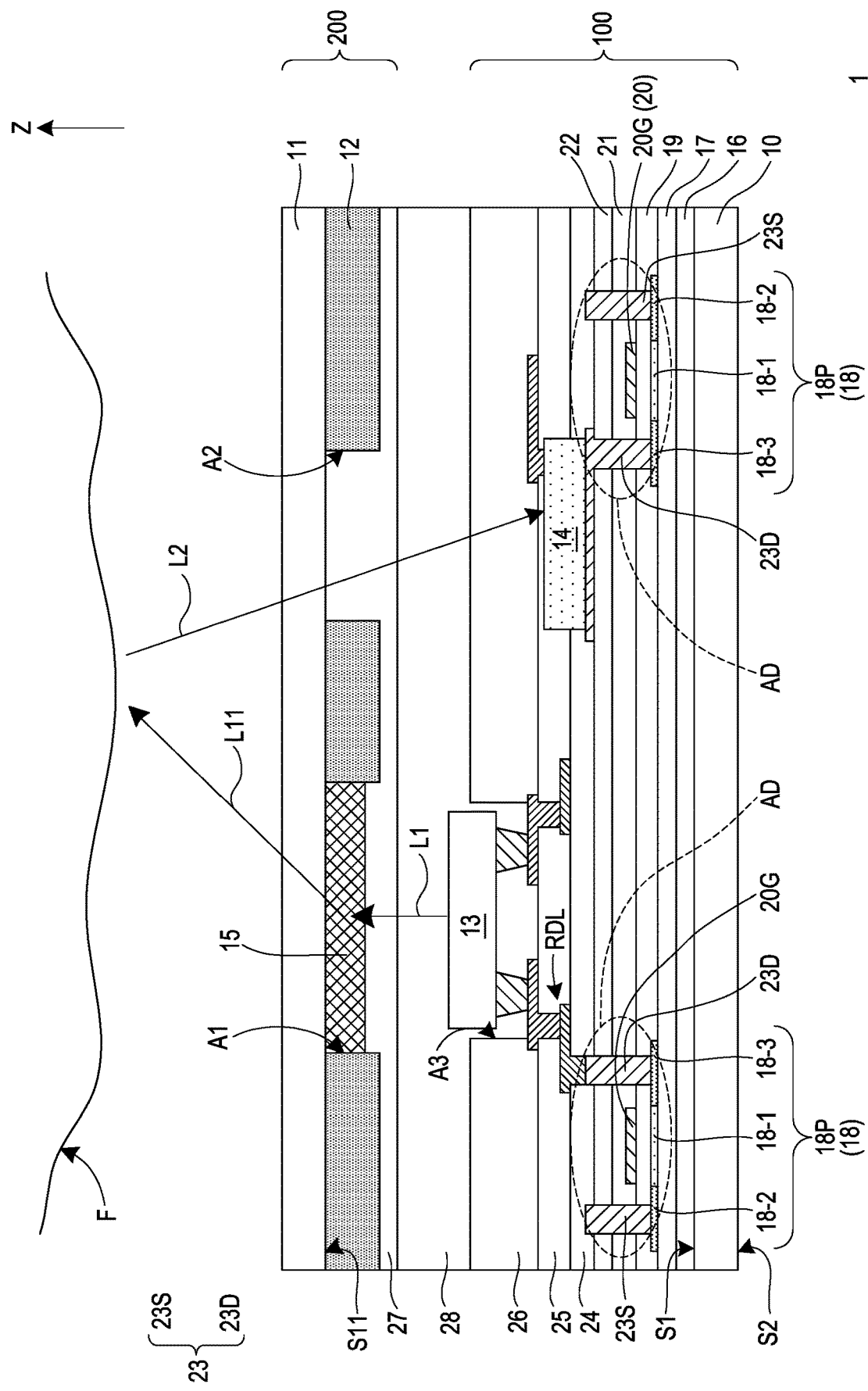
FIG. 1 to FIG. 3 and FIG. 5 to FIG. 15 are respectively partial cross-sectional schematic diagrams of electronic devices according to some embodiments of the disclosure.

Hereinafter, reference will be made in detail to exemplary embodiments of the disclosure, and examples of the exemplary embodiments are illustrated in the figures. Wherever possible, the same reference numerals are used in the figures and the descriptions to refer to the same or similar portions.

Certain terms are used throughout the specification and the appended claims of the disclosure to refer to particular elements. Those skilled in the art should understand that electronic device manufacturers may refer to the same elements under different names. This specification does not intend to distinguish between elements having the same function but different names. In the following description and claims, the words "including" and "containing" and the like are open words, so they should be interpreted as meaning "including but not limited to . . . ."

The terminology mentioned in the specification, such as: "up", "down", "front", "rear", "left", "right", etc., are directions referring to the drawings. Therefore, the directional terms used are used for illustration, not for limiting the disclosure. In the drawings, each drawing depicts general features of methods, structures, and/or materials used in specific embodiments. However, these drawings should not be construed to define or limit the scope or nature covered by these embodiments. For example, for clarity, the relative size, thickness, and position of each film, region, and/or structure may be reduced or enlarged.

One structure (or layer, element, substrate) described in the disclosure is located on/above another structure (or layer, element, substrate), which may mean that the two structures are adjacent and directly connected, or it may mean that the two structures are adjacent rather than directly connected. Indirect connection means that there is at least one intermediate structure (or intermediate layer, intermediate element, intermediate substrate, intermediate space) between two structures. The lower surface of one structure is adjacent or directly connected to the upper surface of the intermediate structure, and the upper surface of the other structure is adjacent or directly connected to the lower surface of the intermediate structure. The intermediate structure may be formed by a single-layer or multi-layer physical structure or a non-physical structure without limitation. In the disclosure, when a certain structure is disposed "on" another structure, it may mean that a certain structure is "directly" on the other structure, or that a certain structure is "indirectly" on the other structure. That is, at least one structure is further disposed between the certain structure and the other structure.

The terms "about", "equal to", "equal" or "identical", "substantially" or "roughly" are generally interpreted as being within 20% of a given value or range, or interpreted as being within 10%, 5%, 3%, 2%, 1%, or 0.5% of a given value or range.

The ordinal numbers used in the specification and claims, such as "first", "second", etc., are used to modify an element. They do not themselves imply and represent that the element(s) have any previous ordinal number, and also do not represent the order of one element and another element, or the order of manufacturing methods. The use of these ordinal numbers is to clearly distinguish an element with a certain name from another element with the same name. The same terms may not be used in the claims and the specification, and accordingly, the first component in the specification may be the second component in the claims.

The electrical connection or coupling described in the disclosure may refer to direct connection or indirect connection. In the case of direct connection, the endpoints of the elements on two circuits are directly connected or connected to each other by a conductive line segment. In the case of indirect connection, there is a switch, diode, capacitor, inductor, resistor, other suitable elements, or a combination of the elements between the endpoints of the elements on the two circuits, but the disclosure is not limited thereto.

In the disclosure, the thickness, length, and width may be measured using an optical microscope, and the thickness or width may be measured from a cross-sectional image in an electron microscope, but the disclosure is not limited thereto. In addition, there may be a certain error in any two values or directions for comparison. In addition, the terms "equivalent", "equal", "same", "substantially", or "essentially" mentioned in the disclosure usually represent within 10% of a given value or range. In addition, the phrases "the given range is from a first numerical value to a second numerical value" and "the given range falls within the range of a first numerical value to a second numerical value" mean that the given range contains the first numerical value, the second numerical value, and other values in between. If the first direction is perpendicular to the second direction, the angle between the first direction and the second direction may be between 80 degrees and 100 degrees. If the first direction is parallel to the second direction, the angle between the first direction and the second direction may be between 0 degrees and 10 degrees.

It should be noted that in the following embodiments, the features in several different embodiments may be replaced, recombined, and mixed to complete other embodiments without departing from the spirit of the disclosure. As long as the features between the embodiments do not violate the spirit of the disclosure or conflict with one another, they may be mixed and used arbitrarily.

Unless otherwise defined, all terms (including technical and scientific terms) used herein have the same meaning as commonly understood by those skilled in the art to which the disclosure belongs. It should be understood that, these terms, such as those defined in commonly used dictionaries, should be interpreted as having meaning consistent with the relevant technique and the background or context of the disclosure, and should not be interpreted in an idealized or excessively formal way, unless specifically defined in an embodiment of the disclosure.

In the disclosure, an electronic device may include a display device, a backlight device, an antenna device, a sensing device, or a tiling device, but the disclosure is not limited thereto. The electronic device may be a bendable or flexible electronic device. The display device may be a non-self-luminous type display device or a self-luminous type display device. The antenna device may be a liquid-crystal type antenna device or a non-liquid-crystal type antenna device, and the sensing device may be a sensing device sensing capacitance, light, heat, or ultrasound, but the disclosure is not limited thereto. In the disclosure, the electronic element may include a passive element and an active element, such as a capacitor, a resistor, an inductor, a diode, a transistor, and so on. The diode may include a light-emitting diode or a photodiode. The light-emitting diode may include, for example, an organic light-emitting diode (OLED), a mini LED, a micro LED, or a quantum dot LED, but the disclosure is not limited thereto. The tiling device may be, for example, a display tiling device or an antenna tiling device, but the disclosure is not limited thereto. It should be noted that the electronic device may be any combination of the above, but the disclosure is not limited thereto. The following uses a display device as an electronic device or a tiling device to explain the content of the disclosure, but the disclosure is not limited thereto.

It should be noted that the technical solutions provided by the different embodiments below may be used interchangeably, combined, or mixed to form another embodiment without violating the spirit of the disclosure.

FIG. 1 to FIG. 3 and FIG. 5 to FIG. 15 are respectively partial cross-sectional schematic diagrams of electronic devices according to some embodiments of the disclosure. FIG. 4 is a schematic partial top view of a light-impermeable layer according to some embodiments of the disclosure.

Please refer to FIG. 1, an electronic device 1 may include a first substrate 10, a second substrate 11, a light-impermeable layer 12, a light-emitting unit, 13 and a photosensor 14. The second substrate 11 is opposite to the first substrate 10. The light-impermeable layer 12 is disposed between the first substrate 10 and the second substrate 11 and includes a first opening A1 and a second opening A2. The light-emitting unit 13 is disposed between the first substrate 10 and the second substrate 11 and overlapped with the first opening A1. The photosensor 14 is disposed on the first substrate 10 and overlapped with the second opening A2.

The first substrate 10 and the second substrate 11 may be rigid substrates or flexible substrates. For example, the material of the first substrate 10 and the second substrate 11 may include plastic, glass, ceramic, quartz, sapphire, or a combination of the above materials, but the disclosure is not limited thereto.

The light-impermeable layer 12 may include a layer having a transmittance of less than 50% for light in the visible light waveband (light with a wavelength of 400 nm to 700 nm). For example, the material of the light-impermeable layer 12 may include a photoresist material added with a light-absorbing particle (such as carbon black), but the disclosure is not limited thereto. In some embodiments, the light-impermeable layer 12 may be a light-shielding layer, such as a black matrix, but the disclosure is not limited thereto.

In some embodiments, the light-impermeable layer 12 is disposed on a surface S11 of the second substrate 11 facing the first substrate 10, but the disclosure is not limited thereto. In other embodiments, although not shown, the light-impermeable layer 12 may be disposed on one or a plurality of film layers between the first substrate 10 and the second substrate 11. In other words, the electronic device 1 may include one or a plurality of light-impermeable layers 12.

The light-emitting unit 13 may include a self-luminous element, such as an organic light-emitting diode, a mini light-emitting diode, a micro light-emitting diode, or a quantum dot light-emitting diode, but the disclosure is not limited thereto. The light-emitting unit 13 is disposed between the first substrate 10 and the light-impermeable layer 12, wherein the light-emitting unit 13 is overlapped with the first opening A1 in the normal direction (such as direction Z) of the surface of the first substrate 10, so that a light beam L1 emitted by the light-emitting unit 13 may pass through via the first opening A1 of the light-impermeable layer 12 and be output from the electronic device 1.

In some embodiments, the light beam L1 emitted by the light-emitting unit 13 may be used for identity recognition, such as biological sensing, such as fingerprint sensing. In some embodiments, the light beam L1 emitted by the light-emitting unit 13 may also be used for image display. For example, the electronic device 1 may include a plurality of light-emitting units 13. The plurality of light-emitting units 13 include a plurality of light-emitting elements emitting light in the visible light waveband, and the plurality of light-emitting elements may be arranged in an array to provide a display screen. Correspondingly, the light-impermeable layer 12 may include a plurality of first openings A1 overlapped with the plurality of light-emitting units 13 respectively, so as to allow the light beam L1 emitted by the plurality of light-emitting units 13 to pass.

The photosensor 14 may be configured to receive a light beam L2 reflected by a test object F for identity recognition. Specifically, the photosensor 14 is overlapped with the second opening A2 in the normal direction (such as direction Z) of the surface of the first substrate 10, so that the light beam L2 reflected by the test object F may be transmitted to the photosensor 14 via the second opening A2 of the light-impermeable layer 12. For example, the photosensor 14 may include a photodiode, a photo-transistor, a metal-semiconductor-metal photodetector (MSM photo-detector), etc., but the disclosure is not limited thereto. The photodiode may include an inorganic photodiode or an organic photodiode (OPD). In some embodiments, the test object F may be, for example, a finger, so that the photosensor 14 may sense a fingerprint for fingerprint recognition.

Figure 12:
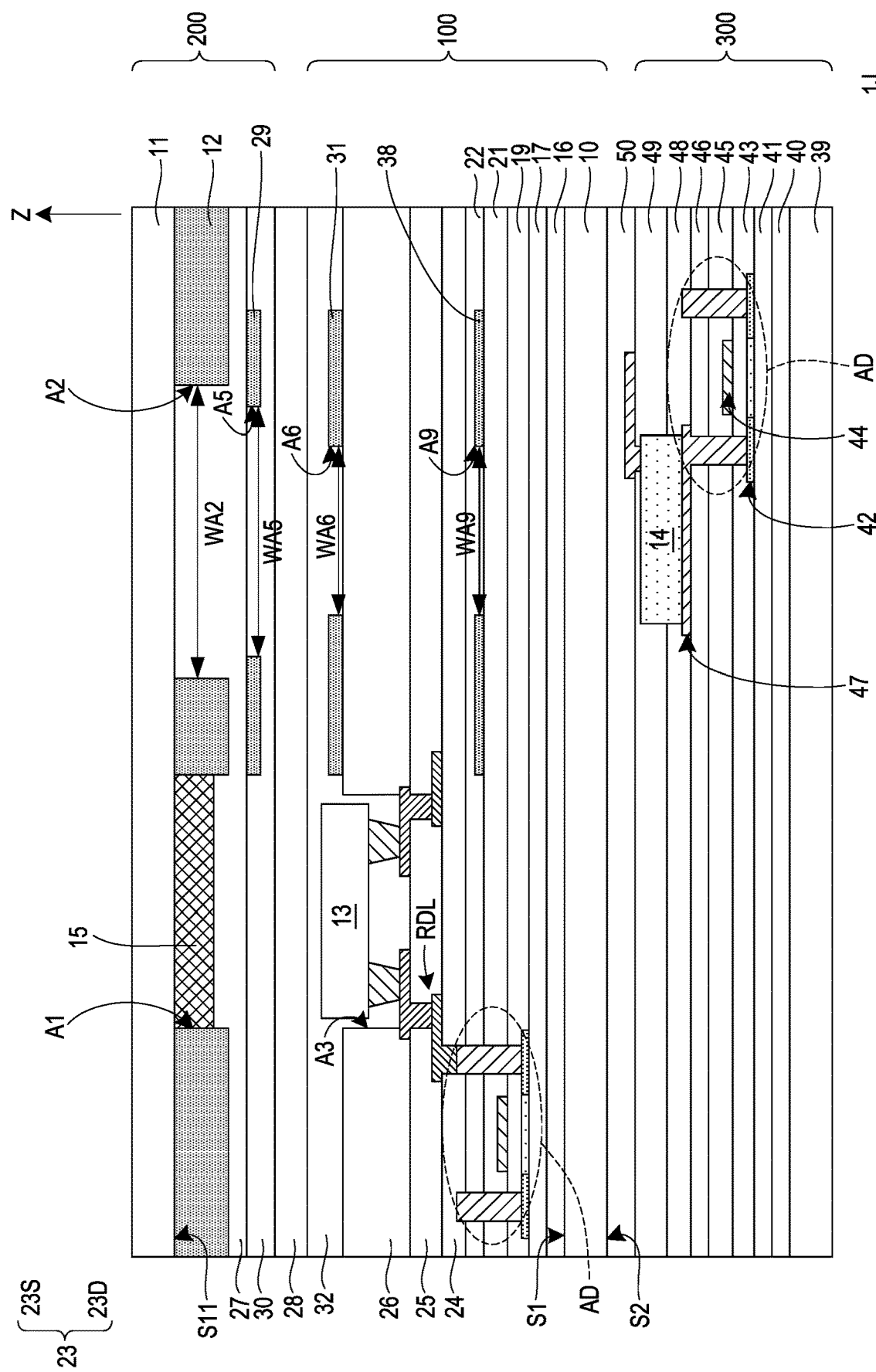

In some embodiments, the first substrate 10 includes a first side S1 and a second side S2 opposite to the first side S1, wherein the first side S1 is closer to the second substrate 11 than the second side S2, and the photosensor 14 is disposed on the first side S1. For example, the photosensor 14 is disposed between the first substrate 10 and the light-impermeable layer 12, but the disclosure is not limited thereto. In other embodiments, the photosensor 14 may be disposed on the second side S2 (as shown in FIG. 12). In other words, the light-emitting unit 13 and the photosensor 14 may be disposed at opposite sides of the first substrate 10, respectively.

In some embodiments, the photosensor 14 may be configured to sense a fingerprint, but the disclosure is not limited thereto. In some embodiments, the electronic device 1 may include a plurality of photosensors 14, and the plurality of photosensors 14 may be arranged in an array. Correspondingly, the light-impermeable layer 12 may include a plurality of second openings A2 overlapped with the plurality of photosensors 14 respectively, so that the plurality of photosensors 14 respectively receive a plurality of light beams L2 reflected by the test object F.

By disposing the photosensor 14 adjacent to the light-emitting unit 13, for example, disposing the photosensor 14 in the display region of the electronic device 1, an opening does not need to be formed in the peripheral region of the electronic device 1 to accommodate the sensing module for identity recognition. Therefore, the issue of reduced screen-to-body ratio may be alleviated or a narrow frame or frameless design may be achieved. According to different specifications or designs, the display region of the electronic device 1 may be partially or fully used for identity recognition. Correspondingly, the photosensor 14 may be arranged in a portion or all of the display region.

According to different requirements, the electronic device 1 may also include other elements or film layers. For example, as shown in FIG. 1, the electronic device 1 may further include a first color filter 15. The first color filter 15 may be disposed in the first opening A1 to improve the color purity of a light beam L11 output from the electronic device 1 and/or to improve the contrast of the electronic device 1.

In other embodiments, the first color filter 15 may also be replaced with a wavelength conversion layer to increase the color saturation of the light beam L11 output from the electronic device 1. The wavelength conversion layer may include a single-layer or multi-layer structure. The wavelength conversion layer may be excited by, for example, a short-wavelength light/light beam, and convert the short-wavelength light/beam into a long-wavelength light/light beam. For example, the material of the wavelength conversion layer may include fluorescence, phosphor, quantum dot (QD), other suitable materials, or a combination of at least two of the above, but the disclosure is not limited thereto. In other embodiments, the first color filter 15 and the wavelength conversion layer may be disposed in the first opening A1 at the same time, wherein the wavelength conversion layer may be disposed between the first color filter 15 and the light-emitting unit 13.

In some embodiments, as shown in FIG. 1, the electronic device 1 may also include a buffer layer 16, a buffer layer 17, a semiconductor layer 18, a gate insulating layer 19, a conductive layer 20, a dielectric layer 21, a dielectric layer 22, a conductive layer 23, a flat layer 24, a flat layer 25, an insulating layer 26, a flat layer 27, and a bonding layer 28, but the disclosure is not limited thereto. According to different requirements, the electronic device 1 may include or omit one or a plurality of elements or film layers.

The buffer layer 16 and the buffer layer 17 are sequentially disposed on the first side S1 of the first substrate 10. For example, the material of the buffer layer 16 and the buffer layer 17 may include an inorganic material, such as silicon oxide (SiOx) or silicon nitride (SiNx), but the disclosure is not limited thereto.

The semiconductor layer 18 is disposed on the buffer layer 17. For example, the material of the semiconductor layer 18 includes an oxide semiconductor material, such as indium gallium zinc oxide (IGZO), but the disclosure is not limited thereto. In other embodiments, the material of the semiconductor layer 18 may include amorphous silicon, polysilicon, metal oxide, or a combination thereof (for example, when there are a plurality of active elements in the circuit). The semiconductor layer 18 is, for example, a patterned semiconductor layer and may include a plurality of semiconductor patterns 18P. The semiconductor patterns 18P may include a channel region 18-1, a source region 18-2, and a drain region 18-3, wherein the channel region 18-1 is located between the source region 18-2 and the drain region 18-3. According to some embodiments, the metal oxide may be indium gallium zinc oxide (IGZO).

The gate insulating layer 19 is disposed on the semiconductor layer 18 and covers the buffer layer 17 exposed by the semiconductor layer 18. For example, the material of the gate insulating layer 19 may include an inorganic material, such as silicon oxide or silicon nitride, but the disclosure is not limited thereto.

The conductive layer 20 is disposed on the gate insulating layer 19. For example, the material of the conductive layer 20 includes a metal or a metal stack, such as aluminum, molybdenum, or titanium/aluminum/titanium. The conductive layer 20 is, for example, a patterned conductive layer and may include a plurality of gates 20G, a plurality of signal lines (not shown), etc., but the disclosure is not limited thereto. The plurality of gates 20G are respectively disposed above a plurality of channel regions 18-1.

The dielectric layer 21 and the dielectric layer 22 are sequentially disposed on the conductive layer 20 and cover the gate insulating layer 19 exposed by the conductive layer 20. For example, the material of the dielectric layer 21 and the dielectric layer 22 may include an inorganic material, such as silicon oxide or silicon nitride, but the disclosure is not limited thereto. In some embodiments, although not shown, one of the dielectric layer 21 and the dielectric layer 22 may be omitted.

The conductive layer 23 is disposed on the dielectric layer 22. For example, the material of the conductive layer 23 includes a metal or a metal stack, such as aluminum, molybdenum, or titanium/aluminum/titanium. The conductive layer 23 is, for example, a patterned conductive layer and may include a plurality of sources 23S, a plurality of drains 23D, a plurality of signal lines (not shown), etc., but the disclosure is not limited thereto. The sources 23S penetrate through the dielectric layer 22 and the dielectric layer 21 to be connected to the gate insulating layer 19 and to the source region 18-2. The drains 23D penetrate through the dielectric layer 22 and the dielectric layer 21 to be connected to the gate insulating layer 19 and to the drain region 18-3.

In the electronic device 1, as shown in FIG. 1, each of the gates 20G, one corresponding semiconductor pattern 18P, one corresponding source 23S, and one corresponding drain 23D form one active element AD. According to some embodiments, the active element AD may be, for example, a thin-film transistor. The photosensor 14 may be electrically connected to the drain 23D of one corresponding active element AD (for example, referred to as an active element AD1). The photosensor 14 may convert the optical signal into an electrical signal for identification and analysis by the active element AD1. The light-emitting unit 13 may be electrically connected to the drain 23D of one corresponding active element AD (for example, referred to as an active device AD2) via a redistribution layer RDL. The active element AD2 may drive the light-emitting unit 13 to emit light. The active element AD1 and the active element AD2 may be different active elements. The electronic device 1 may include a plurality of active elements AD. The material of the semiconductor layer 18 included in the plurality of active elements AD may be the same or different. According to some embodiments, the plurality of active elements AD may include an active element AD having amorphous silicon, an active element AD having polysilicon, an active element AD having a metal oxide, or a combination thereof.

The flat layer 24 and the flat layer 25 are sequentially disposed on the dielectric layer 22. For example, the material of the flat layer 24 and the flat layer 25 includes an organic material or a polymer material, such as polymethyl methacrylate (PMMA), epoxy, acrylic-based resin, silicone, polyimide polymer, or a combination of the above, but the disclosure is not limited thereto.

As shown in FIG. 1, the insulating layer 26 may be disposed between the first substrate 10 and the second substrate 11, for example, may be disposed on the flat layer 25. The insulating layer 26 is, for example, a pixel definition layer, and the material of the insulating layer 26 may include a polymer material, such as resin, but the disclosure is not limited thereto. In some embodiments, the insulating layer 26 is formed by a light-permeable polymer material, and the insulating layer 26 includes a third opening A3, wherein the light-emitting unit 13 is disposed in the third opening A3.

The flat layer 27 is disposed on the light-impermeable layer 12 and covers the first color filter 15 and the surface Sli of the first substrate 10 exposed by the second opening A2. For example, the material of the flat layer 27 may include polymethyl methacrylate, epoxy resin, acrylic resin, silicone, polyimide polymer, or a combination of the above, but the disclosure is not limited thereto.

The bonding layer 28 bonds the flat layer 27 and the insulating layer 26. For example, the material of the bonding layer 28 may include optical clear adhesive (OCA) or optical clear resin (OCR), but the disclosure is not limited thereto.

As shown in FIG. 1, the first substrate 10 and the elements and film layers formed on the first substrate 10 may form a first substrate structure 100. For example, in detail, the first substrate structure 100 may include the first substrate 10, the active element AD, the light-emitting unit 13, and the photosensor 14. The second substrate 11 and the elements and film layers formed on the second substrate 11 may form a second substrate structure 200. For example, in detail, the second substrate structure 200 may include the second substrate 11, the light-impermeable layer 12, the first color filter 15, and the flat layer 27. The first substrate structure 100 and the second substrate structure 200 may be bonded together via the bonding layer 28.

According to some embodiments, in the electronic device, the light-impermeable layer 12 between the first substrate 10 and the second substrate 11 has the first opening A1 and the second opening A2, the light-emitting unit 13 is overlapped with the first opening A1, and the photosensor 14 is overlapped with the second opening A2. The light (such as the light beam L11) emitted by the light-emitting unit 13 may be transmitted out via the first opening A1, and the photosensor 14 may sense via the second opening A2. According to some embodiments, the electronic device may have a better display effect and/or a better sensing effect.

Please refer to FIG. 2, the main differences between an electronic device 1A and the electronic device 1 of FIG. 1 are described as follows. In the electronic device 1A, an insulating layer 26A is formed by a light-impermeable polymer material, and the transmittance of the insulating layer 26A to light in the visible light waveband is less than 50%. For example, the material of the insulating layer 26A includes black resin, white resin (such as resin added with a titanium dioxide particle), or gray resin, but the disclosure is not limited thereto. In addition, the insulating layer 26A may include a third opening A3 and a fourth opening A4. The light-emitting unit 13 may be disposed in the third opening A3. The fourth opening A4 may be overlapped with the photosensor 14, that is, the fourth opening A4 is overlapped with the second opening A2 in the normal direction (such as direction Z) of the surface of the first substrate 10, so that the light beam L2 (see FIG. 1) reflected by the test object F may pass through the insulating layer 26A via the fourth opening A4 and be transmitted to the photosensor 14.

The fourth opening A4 and the second opening A2 are at least partially overlapped in direction Z. A width WA4 of the fourth opening A4 may be less than a width WA2 of the second opening A2 to improve the collimation of the light beam (such as the light beam L2 shown in FIG. 1) incident on the photosensor 14 or reduce the interference of stray light on imaging. However, in other embodiments, the width WA4 of the fourth opening A4 may be equal to the width WA2 of the second opening A2. In addition, the width WA4 of the fourth opening A4 may be less than a width WA3 of the third opening A3. In the disclosure, the width of the opening is measured based on the width of the bottom of the hole in a cross-sectional view in a fixed direction.

Figure 2:
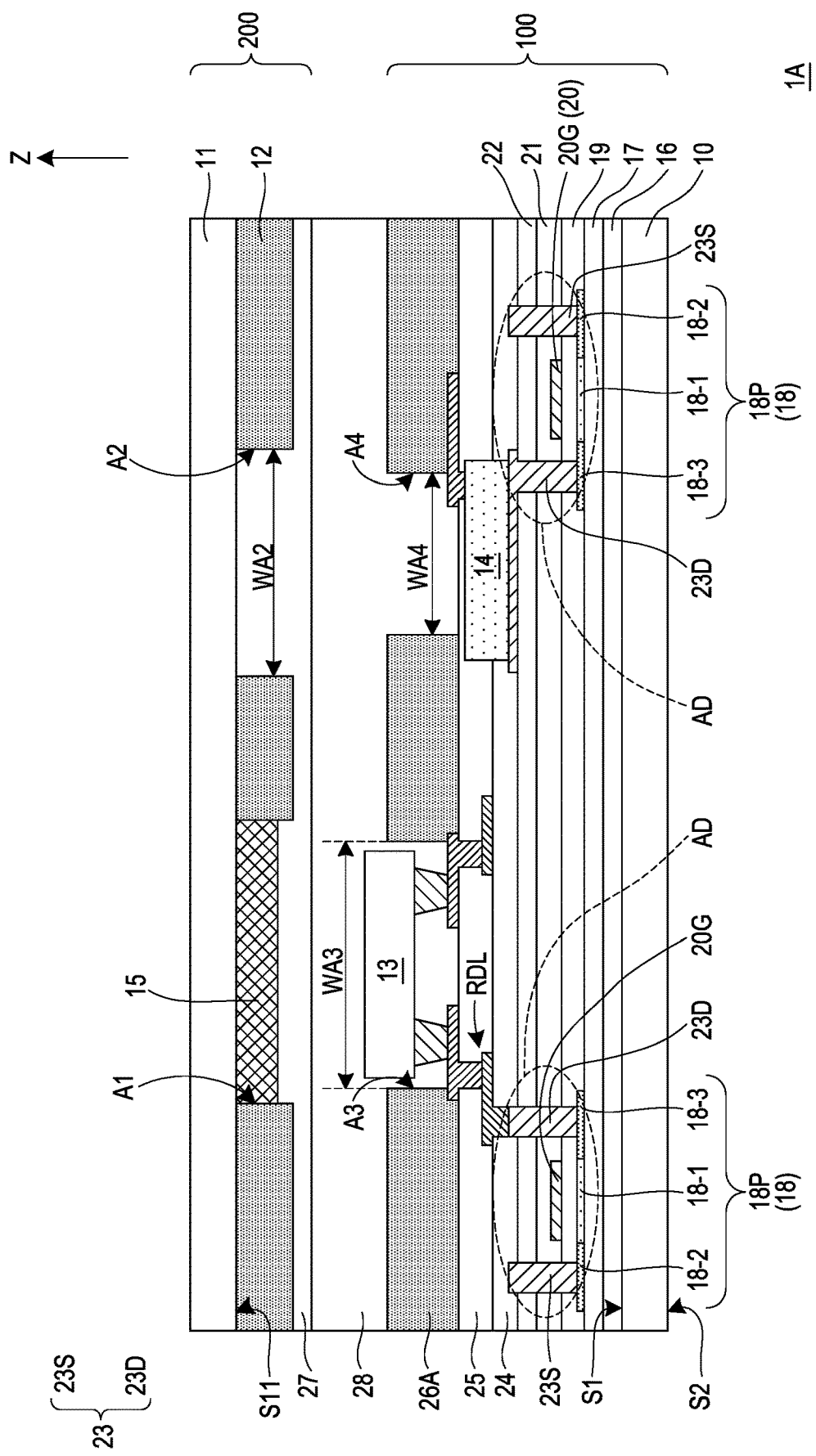

Please refer to FIG. 3, the main differences between an electronic device 1B and the electronic device 1A of FIG. 2 are described as follows.

In the electronic device 1B, the first opening A1 has a tapered contour, so that the light (such as the light beam L11) output from the first opening A1 has a divergent light pattern. For example, the inclination angles of the sidewall surfaces of different openings may be controlled using different types of patterning processes to meet different requirements. For example, the first opening A1 having an inclined contour may be formed using a half tone mask, but the disclosure is not limited thereto. Any opening in the following embodiments may adopt the above inclined contour design, which is not repeated below.

In any embodiment of the disclosure, the first opening A1 and the second opening A2 may have the same or different shapes. As shown in FIG. 4, the shape of the first opening A1 may be a quadrilateral, and the shape of the second opening A2 may be a circle, but the disclosure is not limited thereto. In addition, the first opening A1 and the second opening A2 may have the same or different sizes. The first opening A1 and the second opening A2 of the following embodiments may adopt the above shape/size design, which is not repeated below.

Figure 5:
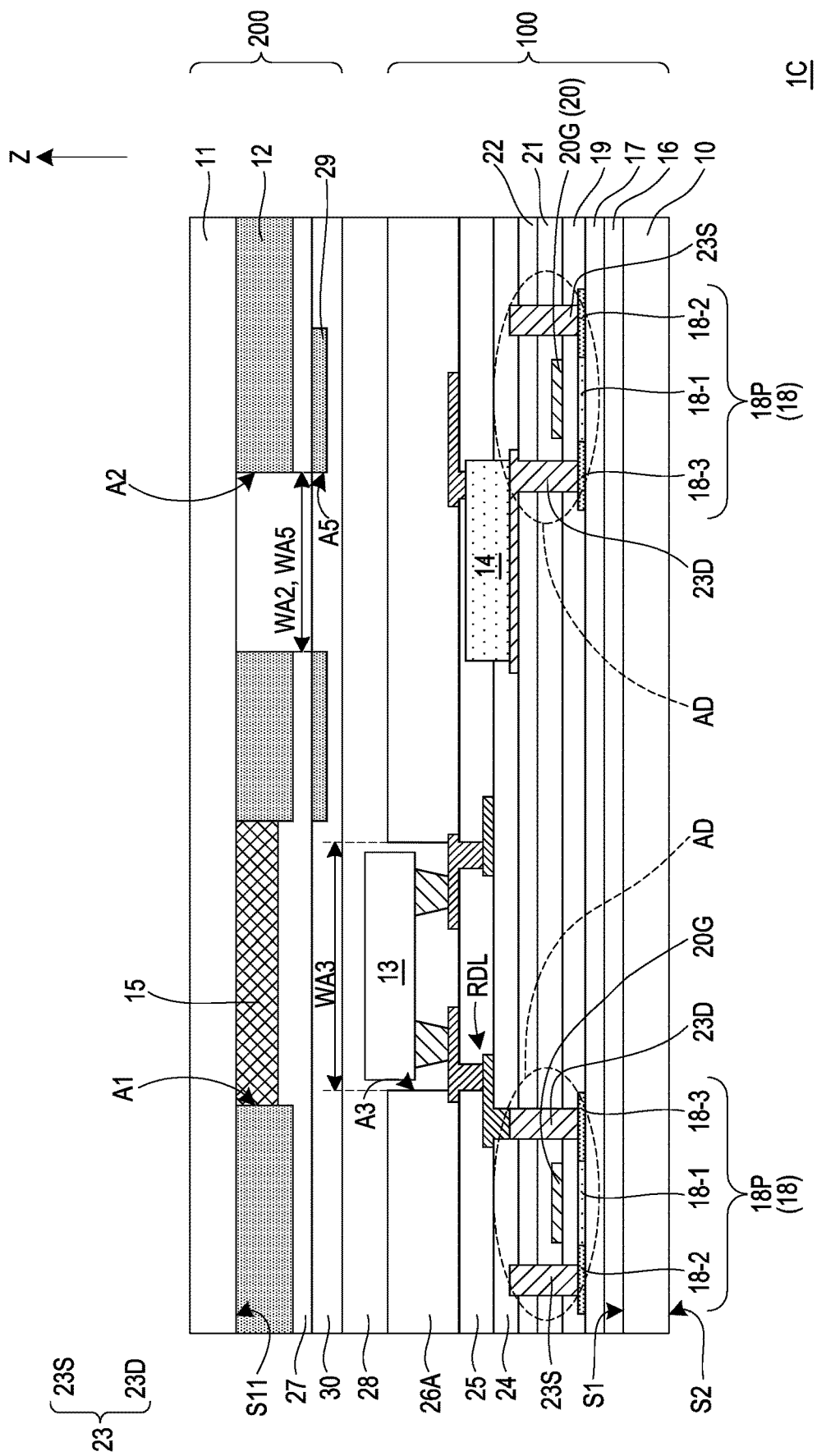

Please refer to FIG. 5, the main differences between an electronic device 1C and the electronic device 1 of FIG. 1 are described as follows.

In addition to the light-impermeable layer 12 (also referred to as the first light-impermeable layer), the electronic device 1C further includes a light-impermeable layer 29 (also referred to as the second light-impermeable layer). The second substrate structure 200 may include a second light-impermeable layer (the light-impermeable layer 29). The light-impermeable layer 29 is disposed on the flat layer 27 and between the light-impermeable layer 12 and the photosensor 14. The material of the light-impermeable layer 29 is as provided for the material of the light-impermeable layer 12, and is not repeated herein. The light-impermeable layer 29 includes a fifth opening A5. The fifth opening A5 is overlapped with the photosensor 14, that is, the fifth opening A5 is overlapped with the photosensor 14 in the normal direction (such as direction Z) of the surface of the first substrate 10. In addition, the fifth opening A5 and the second opening A2 are at least partially overlapped in direction Z, wherein a width WA5 of the fifth opening A5 may be equal to the width WA2 of the second opening A2; alternatively, although not shown, the width WA5 of the fifth opening A5 may be less than the width WA2 of the second opening A2.

The electronic device 1C further includes a flat layer 30. The flat layer 30 is disposed on the light-impermeable layer 29 and covers the flat layer 27 exposed by the light-impermeable layer 29. The material of the flat layer 30 is as provided for the material of the flat layer 27, and is not repeated herein. In addition, the bonding layer 28 bonds the flat layer 30 and the insulating layer 26.

Please refer to FIG. 6, the main differences between an electronic device 1D and the electronic device 1 of FIG. 1 are described as follows.

In addition to the light-impermeable layer 12, the electronic device 1D further includes a light-impermeable layer 31 (also referred to as a third light-impermeable layer). The first substrate structure 100 may include a third light-impermeable layer (the light-impermeable layer 31). The light-impermeable layer 31 is disposed on the insulating layer 26 and between the light-impermeable layer 12 and the photosensor 14. The material of the light-impermeable layer 31 is as provided for the material of the light-impermeable layer 12, and is not repeated herein. The light-impermeable layer 31 includes a sixth opening A6. The sixth opening A6 is overlapped with the photosensor 14, that is, the sixth opening A6 is overlapped with the photosensor 14 in the normal direction (such as direction Z) of the surface of the first substrate 10. In addition, the sixth opening A6 and the second opening A2 are at least partially overlapped in direction Z, wherein a width WA6 of the sixth opening A6 may be less than the width WA2 of the second opening A2; alternatively, although not shown, the width WA6 of the sixth opening A6 may be equal to the width WA2 of the second opening A2.

The electronic device 1D further includes a flat layer 32. The flat layer 32 is disposed on the light-impermeable layer 31 and covers the light-emitting unit 13 and the insulating layer 26 exposed by the light-impermeable layer 31. The material of the flat layer 32 is as provided for the material of the flat layer 27, and is not repeated herein. In addition, the bonding layer 28 bonds the flat layer 27 and the flat layer 32.

Figure 6:
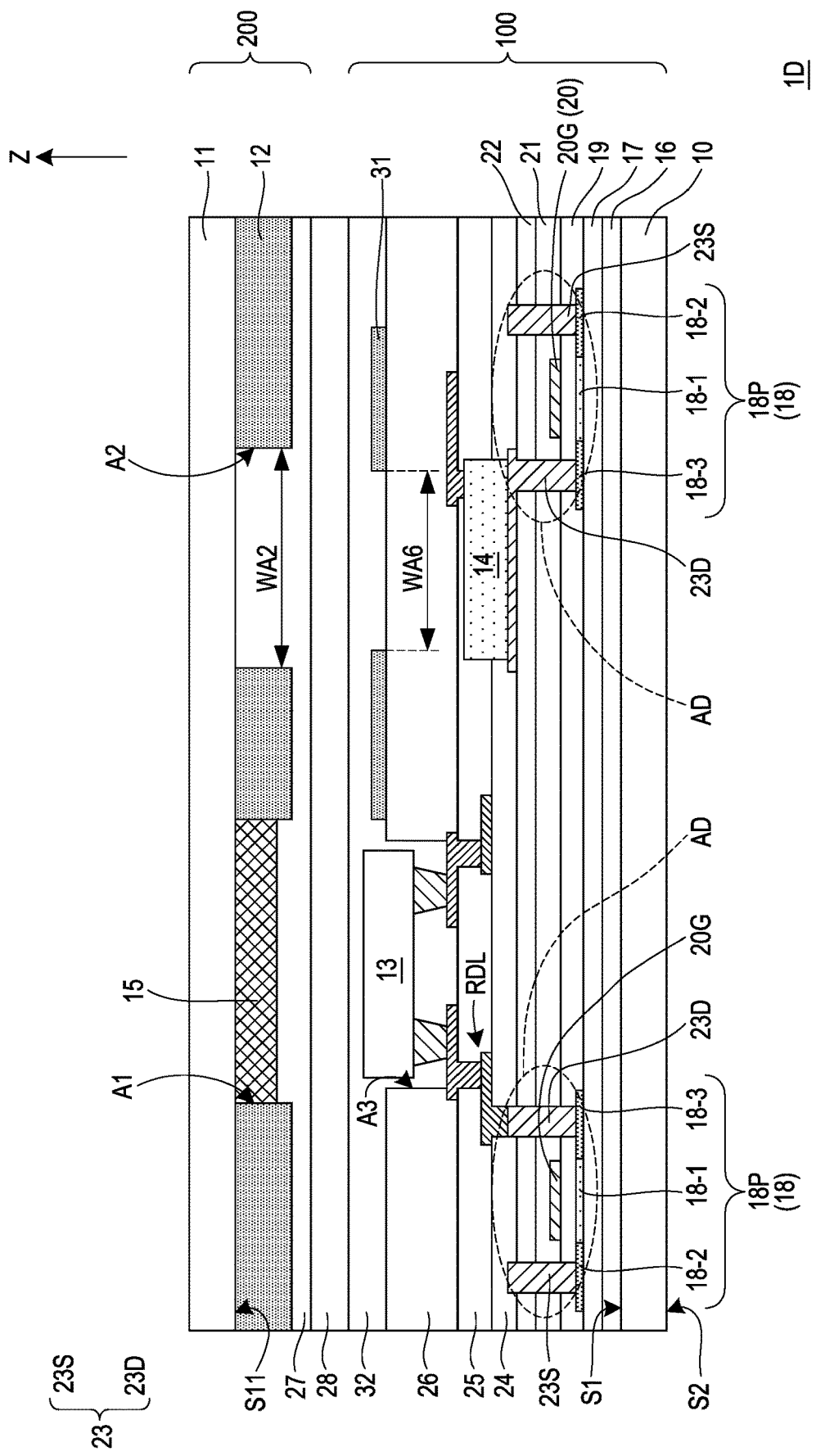

Please refer to FIG. 7, the main differences between an electronic device 1E and the electronic device 1D of FIG. 6 are described as follows.

The electronic device 1E further includes the light-impermeable layer 29 (also referred to as a second light-impermeable layer) and the flat layer 30. Specifically, for example, the electronic device 1E includes a first light-impermeable layer (the light-impermeable layer 12), a second light-impermeable layer (the light-impermeable layer 29), and a third light-impermeable layer (the light-impermeable layer 31). The first substrate structure 100 may include a third light-impermeable layer (the light-impermeable layer 31) and the flat layer 32, and the second substrate structure 200 may include a first light-impermeable layer (the light-impermeable layer 12) and a second light-impermeable layer (the light-impermeable layer 29) and the flat layer 30. The bonding layer 28 may bond the first substrate structure 100 and the second substrate structure 200, for example, the bonding layer 28 may bond the flat layer 32 in the first substrate structure 100 and the flat layer 30 in the second substrate structure 200. In the electronic device 1E, the sixth opening A6 is closer to the photosensor 14 than the fifth opening A5, and the fifth opening A5 is closer to the photosensor 14 than the second opening A2. In some embodiments, the width WA6 of the sixth opening A6 may be less than the width WA5 of the fifth opening A5, and the width WA5 of the fifth opening A5 may be less than the width WA2 of the second opening A2 to improve the collimation of the light beam (the light beam L2 shown in FIG. 1) incident toward the photosensor 14 or reduce the interference of stray light on imaging. However, in other embodiments, although not shown, the width WA6 of the sixth opening A6 may be less than or equal to the width WA5 of the fifth opening A5, and the width WA5 of the fifth opening A5 may be less than or equal to the width WA2 of the second opening A2. For example, the width WA6 of the sixth opening A6 may be equal to the width WA5 of the fifth opening A5 and the width WA2 of the second opening A2. Or, the width WA6 of the sixth opening A6 may be equal to the width WA5 of the fifth opening A5 and less than the width WA2 of the second opening A2. Alternatively, the width WA5 of the fifth opening A5 may be equal to the width WA2 of the second opening A2 and greater than the width WA6 of the sixth opening A6.

In any embodiment of the disclosure, the design of a plurality (such as two or more) of light-impermeable layers and the openings thereof may improve the collimation of the light beam incident on the photosensor or reduce the interference of stray light on imaging, which is not repeated herein.

Figure 8:
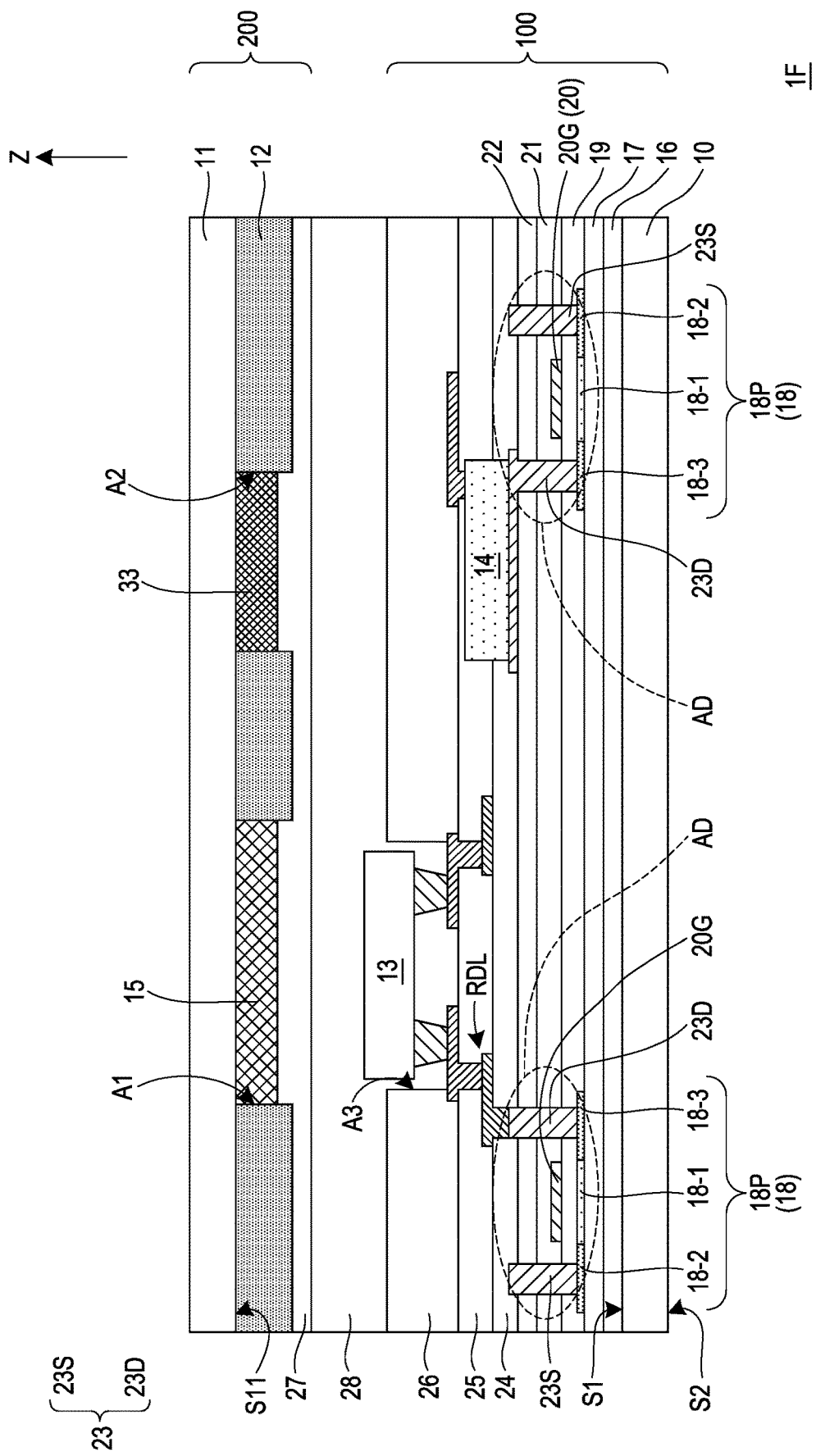

Please refer to FIG. 8, the main differences between an electronic device 1F and the electronic device 1 of FIG. 1 are described as follows.

The electronic device 1F further includes a second color filter 33. The second color filter 33 is disposed in the second opening A2. In this way, the second color filter 33 may be overlapped with the photosensor 14 to reduce the interference of ambient light on imaging. For example, in the case that the photosensor 14 is more sensitive to red light and green light, based on the fact that there are a lot of red light or infrared light (such as light in the IR waveband) in ambient light, the second color filter 33 may select a green color filter to filter the red light or infrared light in the environment, thereby reducing the interference of the ambient light, but the disclosure is not limited thereto.

Figure 3:
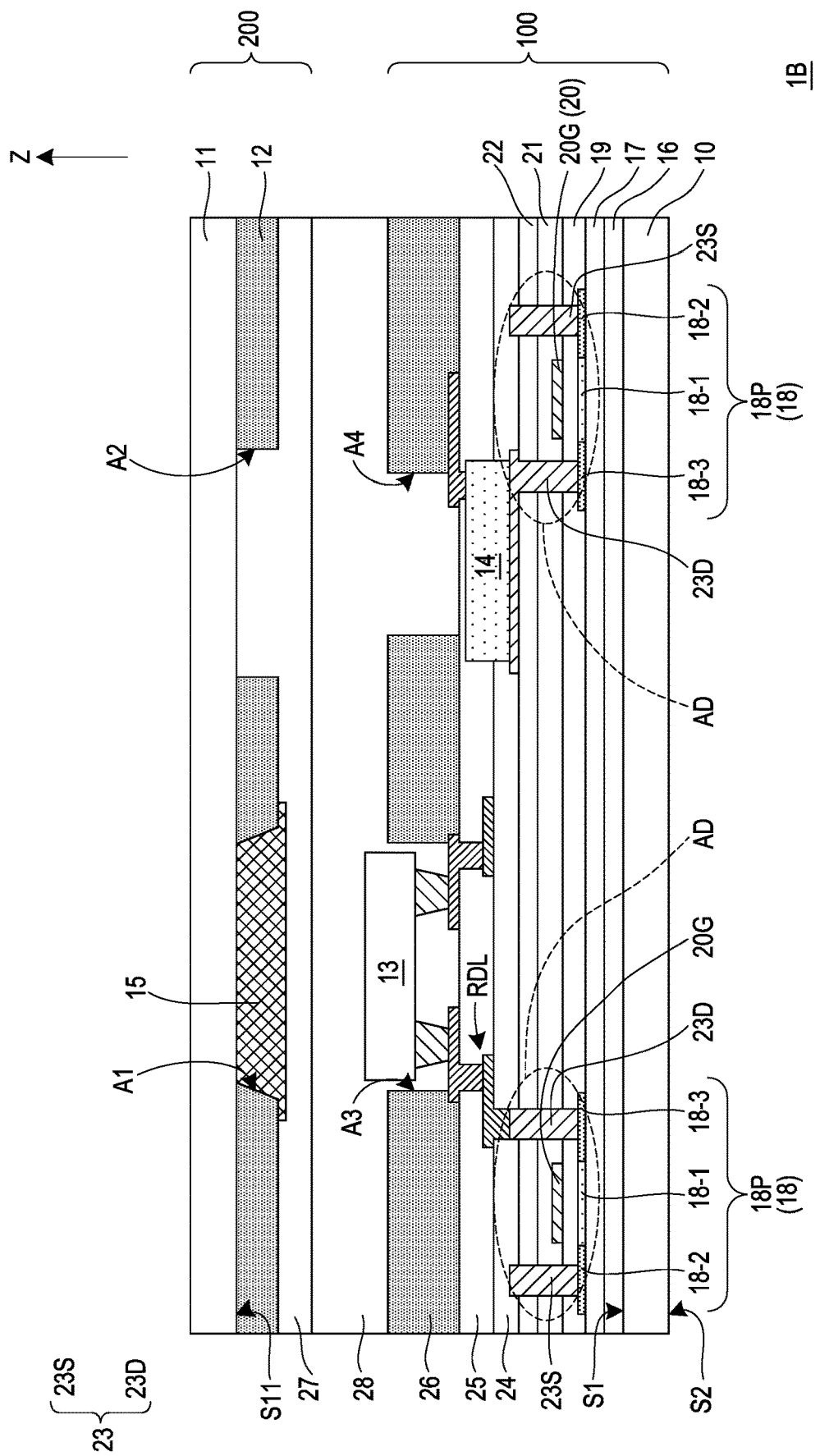
Figure 4:
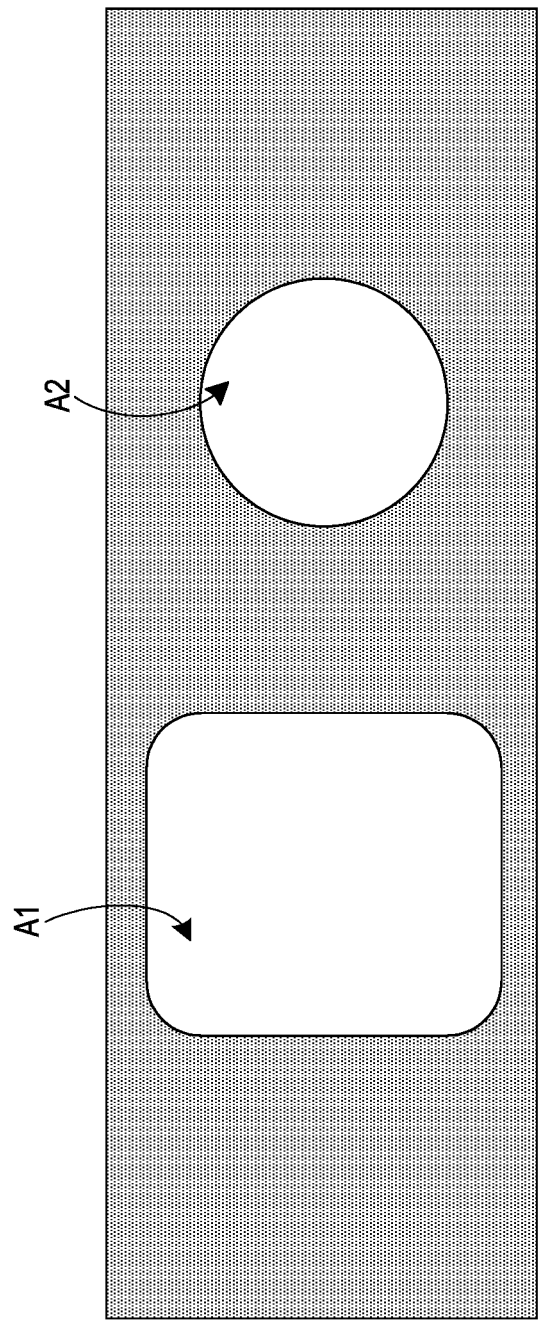
FIG. 4 is a schematic partial top view of a light-impermeable layer according to some embodiments of the disclosure.

Please refer to FIG. 9, the main differences between an electronic device 1G and the electronic device 1B of FIG. 3 are described as follows.

The electronic device 1G further includes the flat layer 32, a light-impermeable layer 34, a wavelength conversion layer 35, and a flat layer 36. According to some embodiments, the wavelength conversion layer 35 may be disposed between the first color filter 15 and the light-emitting unit 13. The flat layer 32 is disposed on the insulating layer 26A and covers the light-emitting unit 13. The light-impermeable layer 34 is disposed on the flat layer 32 and disposed between the light-impermeable layer 12 and the insulating layer 26A. The material of the light-impermeable layer 34 is as provided for the material of the light-impermeable layer 12, and is not repeated herein. The light-impermeable layer 34 includes a seventh opening A7 and an eighth opening A8, wherein the seventh opening A7 is overlapped with the light-emitting unit 13 and the eighth opening A8 is overlapped with the photosensor 14. A width WA8 of the eighth opening A8, the width WA4 of the fourth opening A4, and the width WA2 of the second opening A2 may be the same; alternatively, the width WA4 of the fourth opening A4 may be less than the width WA8 of the eighth opening A8, and the width WA8 of the eighth opening A8 may be less than the width WA2 of the second opening A2.

The wavelength conversion layer 35 is disposed in the seventh opening A7 to enhance the color saturation of the light beam output from the electronic device 1G. The wavelength conversion layer 35 may include a single-layer or multi-layer structure. Taking the first color filter 15 as a red color filter as an example, the wavelength conversion layer 35 may be, for example, a wavelength conversion layer converting short-wavelength light/light beam into red light, but the disclosure is not limited thereto.

The flat layer 36 is disposed on the light-impermeable layer 34 and covers the wavelength conversion layer 35. The material of the flat layer 36 is as provided for the material of the flat layer 27, and is not repeated herein. In addition, the bonding layer 28 bonds the flat layer 27 and the flat layer 36.

Figure 9:
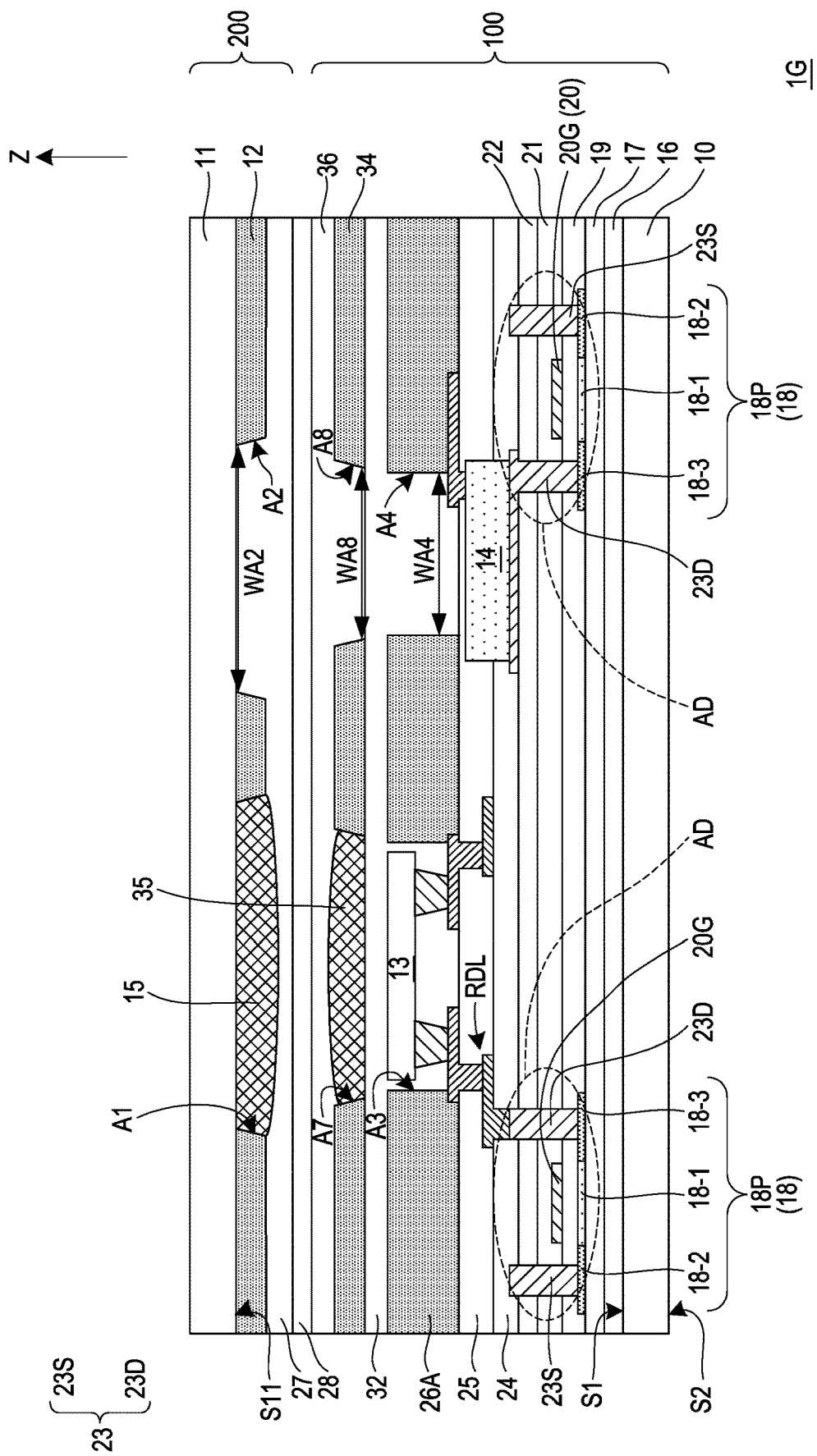

Please refer to FIG. 10, the main differences between an electronic device 1H and the electronic device 1G of FIG. 9 are described as follows.

The electronic device 1H further includes the second color filter 33. Please refer to the above for the detailed content of the second color filter 33, which is not repeated herein.

Figure 10:
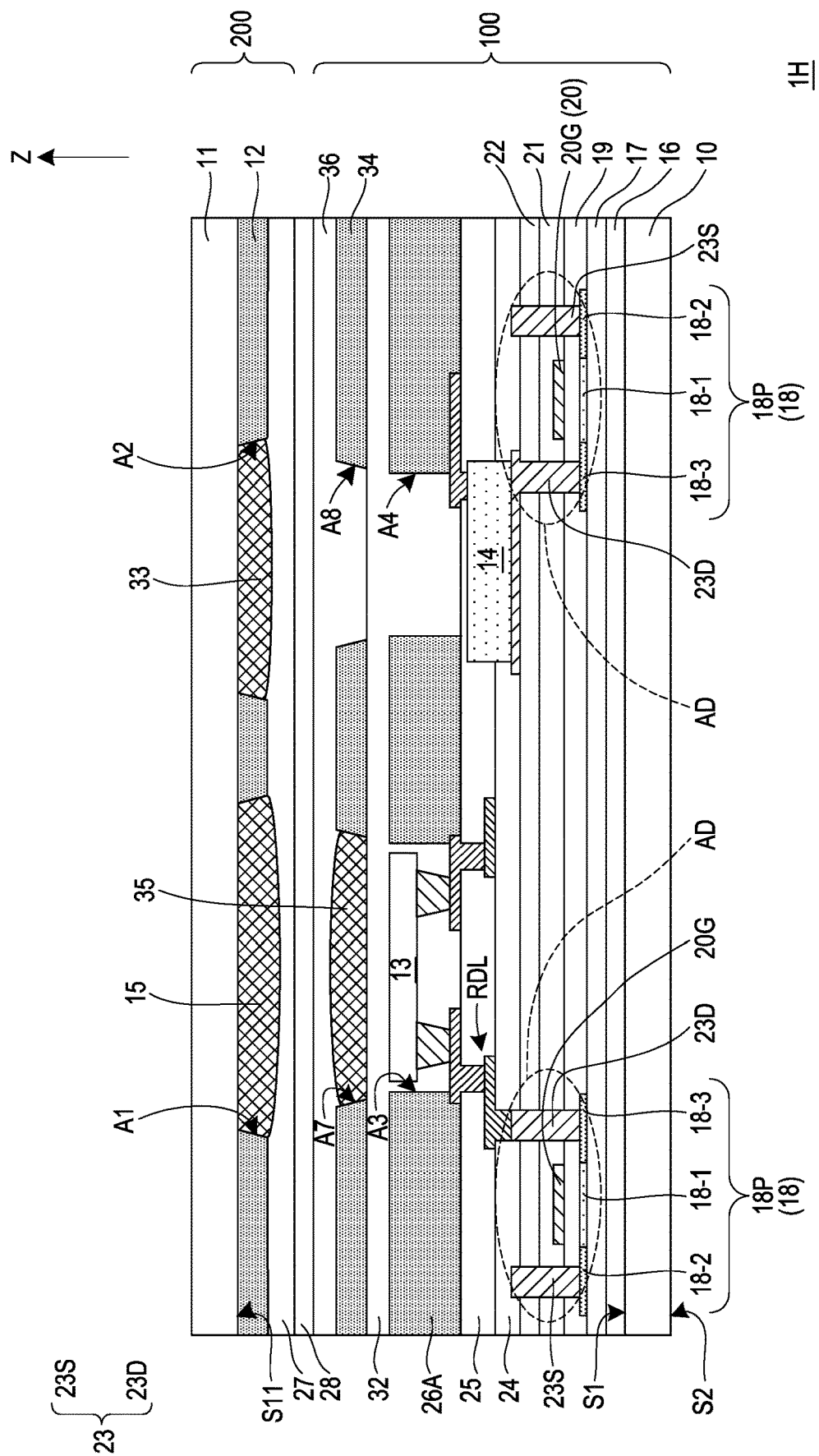
Figure 11:
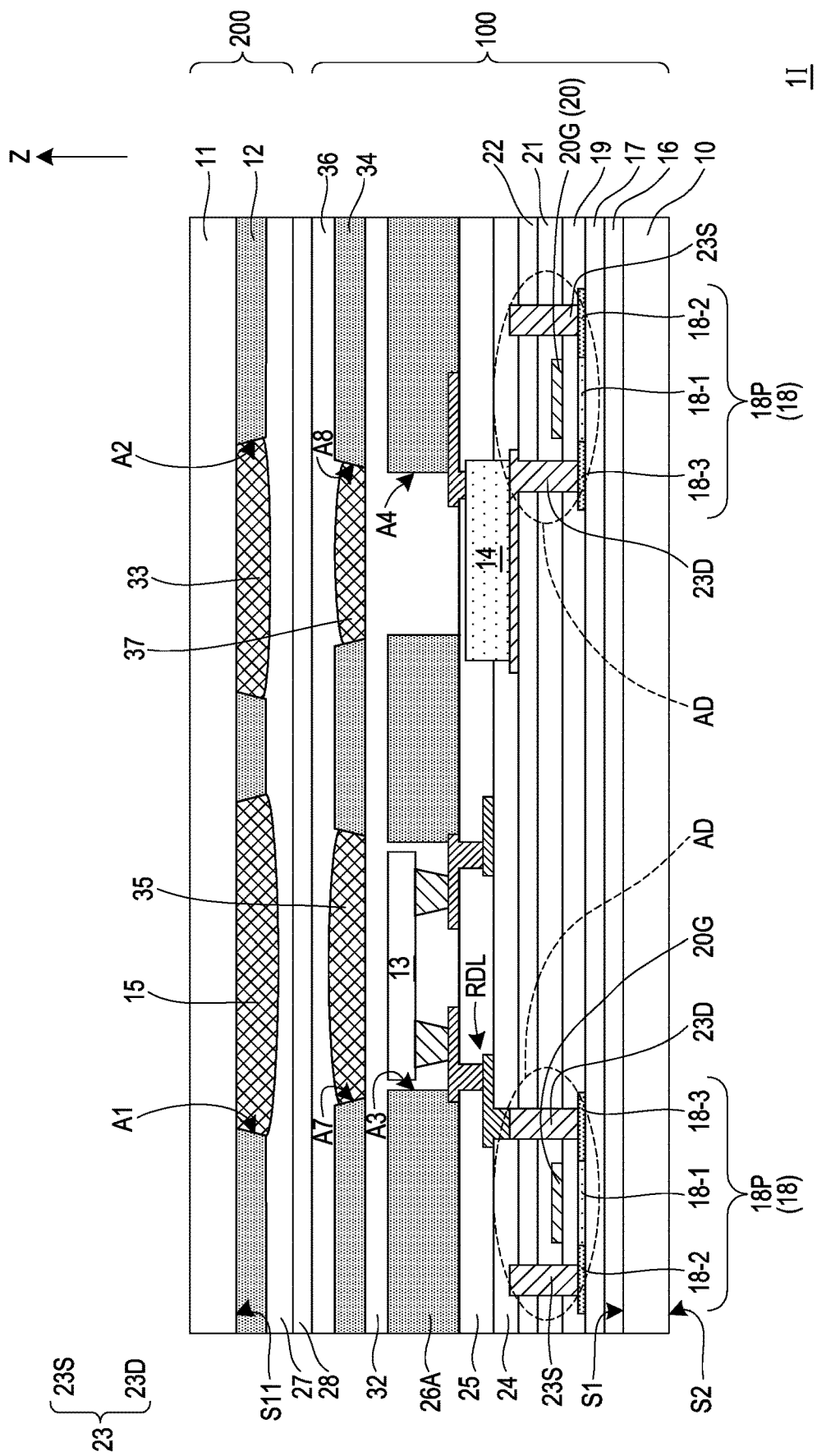

Please refer to FIG. 11, the main differences between an electronic device 1I and the electronic device 1H of FIG. 10 are described as follows.

The electronic device 1I further includes a wavelength conversion layer 37. The wavelength conversion layer 37 is disposed in the eighth opening A8. The wavelength conversion layer 37 may include a single-layer or multi-layer structure. The wavelength conversion layer 37 may be used, for example, to convert the light beam passing through the second color filter 33 into light corresponding to the sensitive waveband of the photosensor 14. For example, if the sensitive waveband of the photosensor 14 is the infrared light waveband, and the second color filter 33 is a green color filter, the wavelength conversion layer 37 may be made of a wavelength conversion material converting green light passing through the second color filter 33 into infrared light, but the disclosure is not limited thereto.

Figure 7:
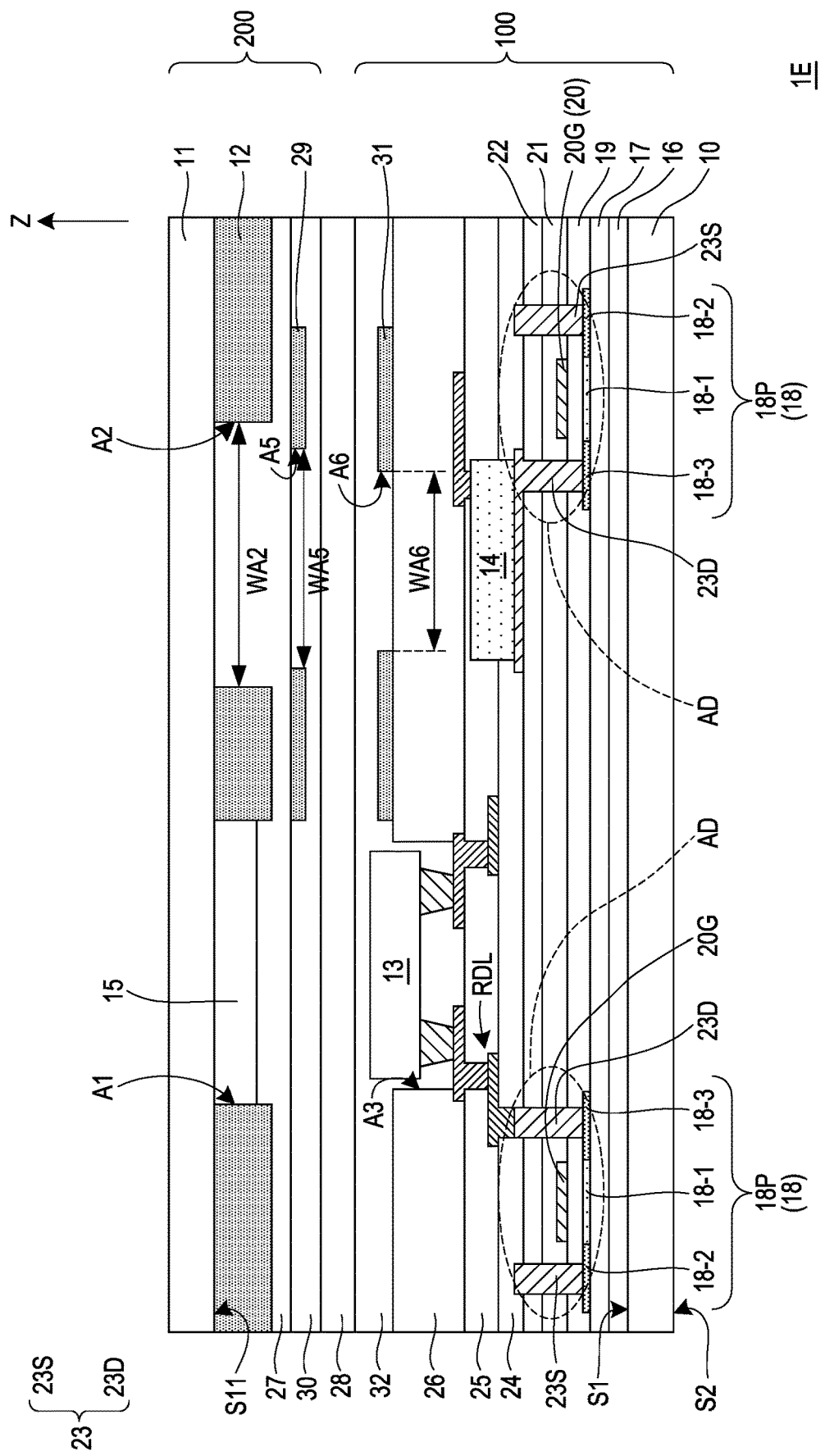

Please refer to FIG. 12, the main differences between an electronic device 1J and the electronic device 1E of FIG. 7 are described as follows.

The electronic device 1J further includes a light-impermeable layer 38 (also referred to as a fourth light-impermeable layer). Specifically, the first substrate structure 100 may include a third light-impermeable layer (the light-impermeable layer 31) and a fourth light-impermeable layer (the light-impermeable layer 38). The light-impermeable layer 38 is disposed on the dielectric layer 21 and disposed between the light-impermeable layer 31 and the photosensor 14. The material of the light-impermeable layer 38 is as provided for the material of the light-impermeable layer 12, and is not repeated herein. The light-impermeable layer 38 includes a ninth opening A9. The ninth opening A9 is overlapped with the photosensor 14, that is, the ninth opening A9 is overlapped with the photosensor 14 in the normal direction (such as direction Z) of the surface of the first substrate 10. Moreover, the ninth opening A9 is at least partially overlapped with the second opening A2, the fifth opening A5, and the sixth opening A6 in direction Z, wherein a width WA9 of the ninth opening A9 may be less than or equal to the width WA6 of the sixth opening A6, the width WA6 of the sixth opening A6 may be less than or equal to the width WA5 of the fifth opening A5, and the width WA5 of the fifth opening A5 may be less than or equal to the width WA2 of the second opening A2. In some embodiments, although not shown, the light-impermeable layer 38 may be omitted.

The electronic device 1J also includes a third substrate structure 300. The third substrate structure 300 includes the photosensor 14. That is, the photosensor 14 is included in the third substrate structure 300 instead of being included in the first substrate structure 100. Specifically, in the electronic device 1J, the photosensor 14 is disposed on the second side S2 of the first substrate 10. For example, the photosensor 14 may be formed on a third substrate 39 to form the third substrate structure 300. The first substrate structure 100 and the third substrate structure 300 are further bonded via a bonding layer 50. More specifically, the third substrate structure 300 in the electronic device 1J may further include a buffer layer 40, a buffer layer 41, a semiconductor layer 42, a gate insulating layer 43, a conductive layer 44, a dielectric layer 45, a dielectric layer 46, a conductive layer 47, a flat layer 48, and a flat layer 49, but the disclosure is not limited thereto. According to different requirements, the electronic device 1J may include or omit one or a plurality of elements or film layers.

In some embodiments, the second side S2 of the first substrate may be bonded to the second side (unmarked) of 39 of the third substrate 39 via the bonding layer 50. In these embodiments, the order of forming the photosensor 14 and the active element AD is reversed, that is, the photosensor 14 is formed at the third substrate 39 first, and then the active element AD is formed.

The detailed content of the third substrate 39 is as provided in the description of the first substrate 10, and is not repeated herein. The detailed content of the buffer layer 40 and the buffer layer 41 is as provided in the description of the buffer layer 16 and the buffer layer 17, and is not repeated herein. The detailed content of the semiconductor layer 42 is as provided in the description of the semiconductor layer 18, and is not repeated herein. The detailed content of the gate insulating layer 43 is as provided in the description of the gate insulating layer 19, and is not repeated herein. The detailed content of the conductive layer 44 is as provided in the description of the conductive layer 20, and is not repeated herein. The detailed content of the dielectric layer 45 and the dielectric layer 4 is as provided in the description of the dielectric layer 21 and the dielectric layer 22, and is not repeated herein. The detailed content of the conductive layer 47 is as provided in the description of the conductive layer 23, and is not repeated herein. The detailed content of the flat layer 48 and the flat layer 49 is as provided in the description of the flat layer 24 and the flat layer 25, and is not repeated herein. The detailed content of the bonding layer 50 is as provided in the description of the bonding layer 28, and is not repeated herein.

In some embodiments, the resolution of the photosensor 14 may be equal to the resolution of the light-emitting unit 13. In some other embodiments, the resolution of the photosensor 14 may be less than the resolution of the light-emitting unit 13. In still some other embodiments, the resolution of the photosensor 14 may be greater than the resolution of the light-emitting unit 13. The resolution of the photosensor 14 is defined as the number of the photosensor 14 per unit area. The resolution of the light-emitting unit 13 is defined as the number of the light-emitting unit 13 per unit area.

Please refer to FIG. 13, the main differences between an electronic device 1K and the electronic device 1A of FIG. 2 are described as follows.

The electronic device 1K further includes the light-impermeable layer 38 (also referred to as a fourth light-impermeable layer). The details of the fourth light-impermeable layer (the light-impermeable layer 38) are as provided above, and are not repeated herein. The ninth opening A9 of the light-impermeable layer 38 is at least partially overlapped with the second opening A2 and the fourth opening A4 in direction Z, wherein the width WA9 of the ninth opening A9 may be less than or equal to the width WA4 of the fourth opening A4, and the width WA4 of the fourth opening A4 may be less than or equal to the width WA2 of the second opening A2. In some embodiments, although not shown, the light-impermeable layer 38 may be omitted.

In the electronic device 1K, the photosensor 14 is disposed on the second side S2 of the first substrate 10. The specific configuration method is as provided in the description of FIG. 12, and is not repeated herein.

Figure 13:
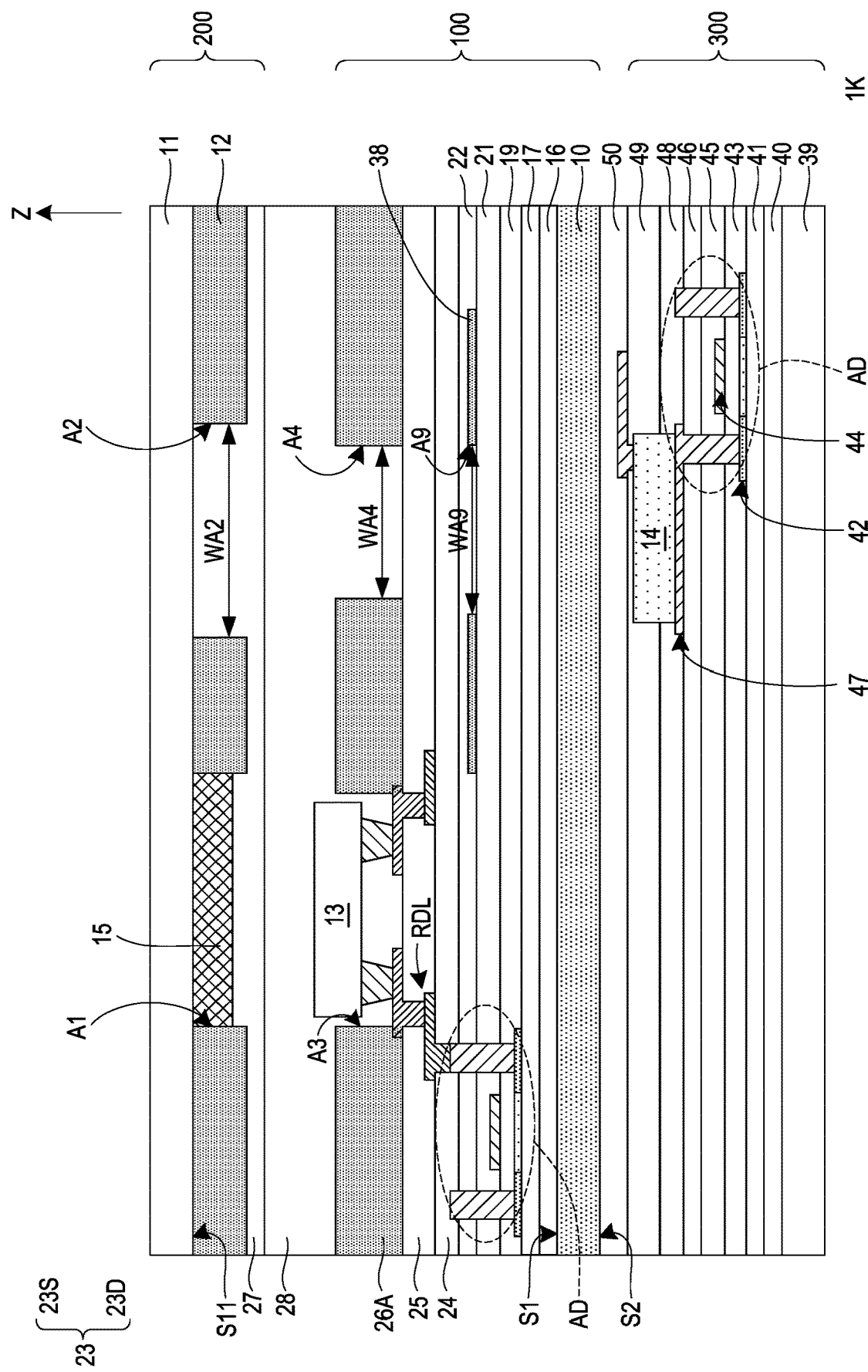

Please refer to FIG. 14, the main differences between an electronic device 1L and the electronic device 1K of FIG. 13 are described as follows.

In the electronic device 1L, the fourth light-impermeable layer (the light-impermeable layer 38) is disposed on the first side S1 of the first substrate 10 and is covered by the buffer layer 16.

Figure 14:
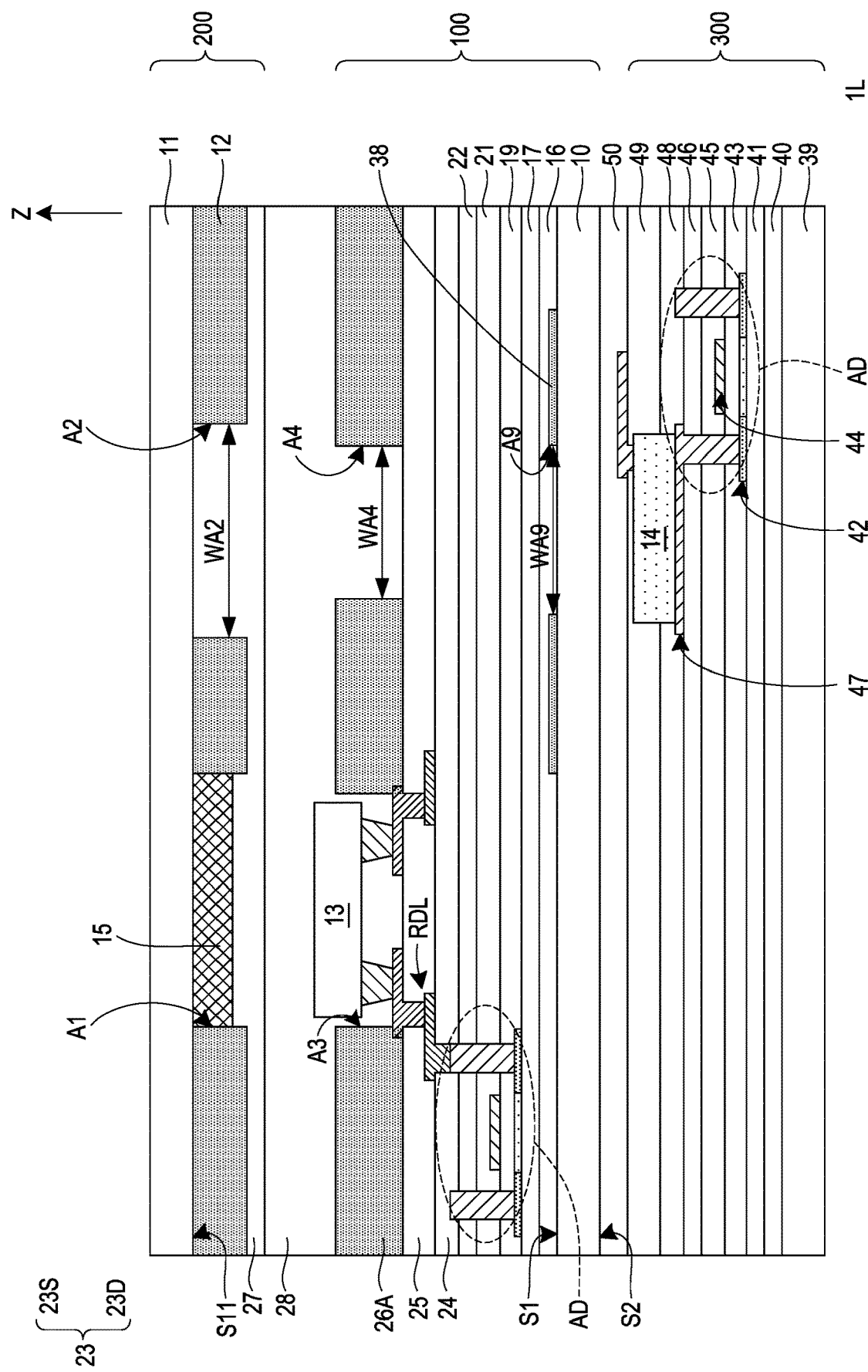
Figure 15:
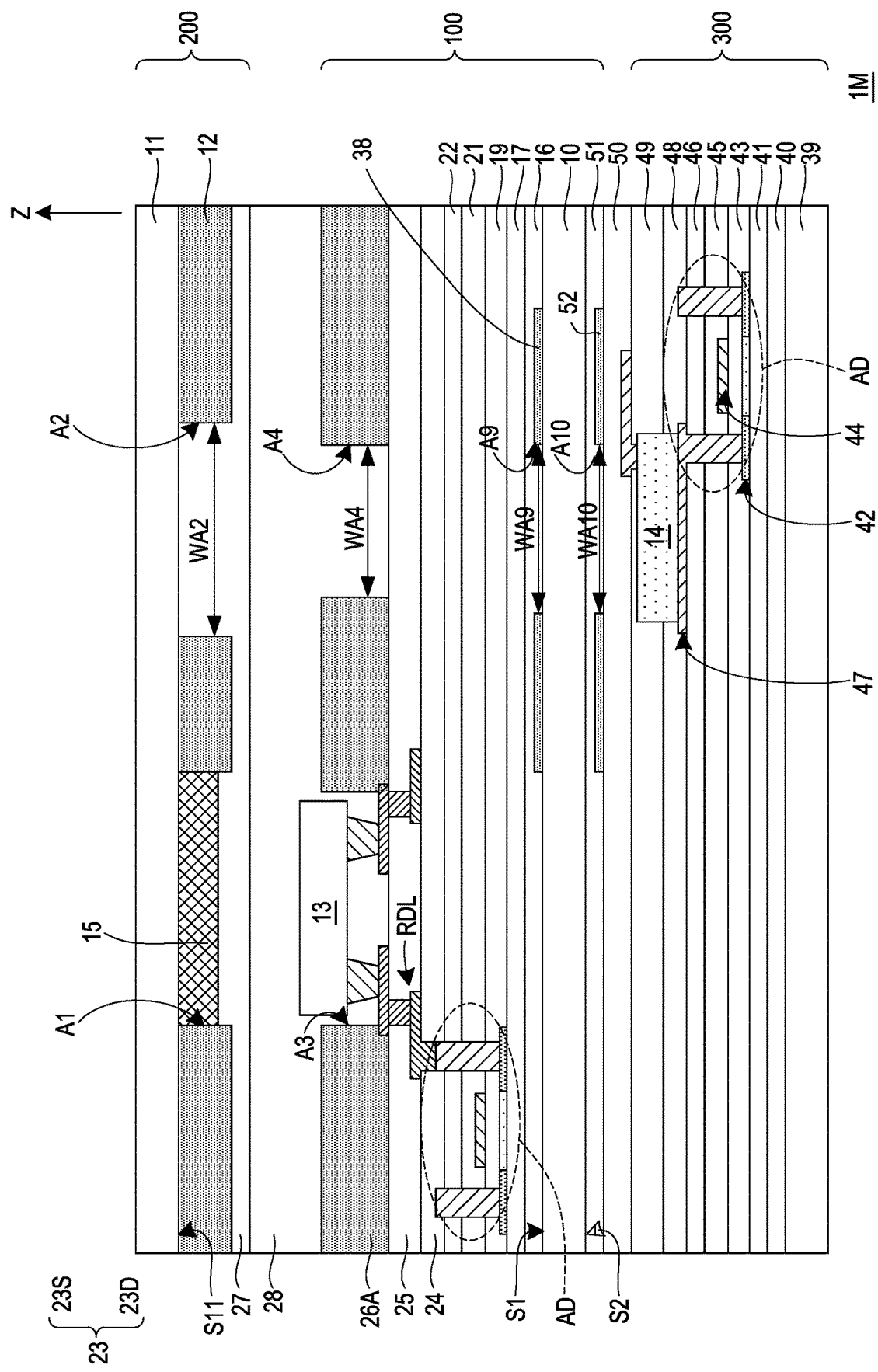

Please refer to FIG. 15, the main differences between an electronic device 1M and the electronic device 1L of FIG. 14 are described as follows.

The electronic device 1M further includes a dielectric layer 51 and a light-impermeable layer 52 (also referred to as a fifth light-impermeable layer). Specifically, for example, the electronic device 1M includes a first light-impermeable layer (the light-impermeable layer 12), a fourth light-impermeable layer (the light-impermeable layer 38), and a fifth light-impermeable layer (the light-impermeable layer 52). The first substrate structure 100 may include a fourth light-impermeable layer (the light-impermeable layer 38) and a fifth light-impermeable layer (the light-impermeable layer 52), and the second substrate structure 200 may include a first light-impermeable layer (the light-impermeable layer 12). The dielectric layer 51 is disposed on the second side S2 of the first substrate 10 and disposed between the bonding layer 50 and the first substrate 10. The material of the dielectric layer 51 is as provided for the material of the dielectric layer 21, and is not repeated herein.

The light-impermeable layer 52 is disposed on the dielectric layer 51 and disposed between the bonding layer 50 and the dielectric layer 51. The material of the light-impermeable layer 52 is as provided for the material of the light-impermeable layer 12, and is not repeated herein. The light-impermeable layer 52 includes a tenth opening A10. The tenth opening A10 is overlapped with the photosensor 14. Moreover, the tenth opening A10 is at least partially overlapped with the second opening A2, the fourth opening A4, and the ninth opening A9 in direction Z, wherein a width WA10 of the tenth opening A10 may be less than or equal to the width WA9 of the ninth opening A9, the width WA9 of the ninth opening A9 may be less than or equal to the width WA4 of the fourth opening A4, and the width WA4 of the fourth opening A4 may be less than or equal to the width WA2 of the second opening A2. In some embodiments, although not shown, at least one of the light-impermeable layer 38 and the light-impermeable layer 52 may be omitted.

Based on the above, in an embodiment of the disclosure, in the electronic device, the light-impermeable layer between the first substrate and the second substrate has the first opening and the second opening, the light-emitting unit is overlapped with the first opening, and the photosensor is overlapped with the second opening. The light emitted by the light-emitting unit may be transmitted out via the first opening, and the photosensor may sense via the second opening. According to some embodiments, the electronic device may have a better display effect and/or a better sensing effect.

The above embodiments are used to describe the technical solution of the disclosure instead of limiting it. Although the disclosure has been described in detail with reference to each embodiment above, those having ordinary skill in the art should understand that the technical solution recited in each embodiment above may still be modified, or some or all of the technical features thereof may be equivalently replaced. These modifications or replacements do not make the essence of the corresponding technical solutions depart from the scope of the technical solution of each embodiment of the disclosure.

Although the embodiments of the disclosure and their advantages are disclosed as above, it should be understood that those skilled in the art, without departing from the spirit and scope of the disclosure, may make changes, substitutions, and modifications, and features between the embodiments may be mixed and replaced at will to form other new embodiments. In addition, the scope of the disclosure is not limited to the manufacturing processes, machines, manufactures, material compositions, devices, methods, and steps in the specific embodiments described in the specification. Those skilled in the art may understand the current or future development processes, machines, manufactures, material compositions, devices, methods, and steps from the content of the disclosure, which may all be adopted according to the disclosure as long as they may implement substantially the same function or obtain substantially the same result in an embodiment described here. Therefore, the scope of the disclosure includes the above manufacturing processes, machines, manufactures, material compositions, devices, methods, and steps. In addition, each claim constitutes an individual embodiment, and the scope of the disclosure also includes the combination of each claim and embodiment. The scope of the disclosure shall be subject to the scope defined by the following claims.

What is claimed is:
1. An electronic device, comprising:
a first substrate;

a second substrate opposite to the first substrate;

a first light-impermeable layer disposed between the first substrate and the second substrate and comprising a first opening and a second opening;

a light-emitting unit disposed between the first substrate and the second substrate and overlapped with the first opening;

a photosensor disposed on the first substrate and overlapped with the second opening;

a first active element and a second active element disposed on the first substrate, wherein the first active element is electrically connected to the light-emitting unit, and the second active element is electrically connected to the photosensor; and a second light-impermeable layer disposed between the first light-impermeable layer and the first active element, and disposed between the first light-impermeable layer and the second active element, wherein the second light-impermeable layer comprises a photoresist material and comprises a third opening and a sixth opening, the third opening is overlapped with the photosensor, the sixth opening is overlapped with the light-emitting unit, and a width of the third opening of the second light-impermeable layer is equal to or less than a width of the second opening of the first light-impermeable layer;

a third light-impermeable layer disposed between the second light-impermeable layer and the first active element, and disposed between the second light-impermeable layer and the second active element, wherein the second light-impermeable layer is disposed between the first light-impermeable layer and third light-impermeable layer, the third light-impermeable layer comprises a fourth opening and a fifth opening, and the light-emitting unit is disposed in the fourth opening , and the fifth opening is overlapped with the photosensor;

a first connecting electrode disposed on a lower side of the photosensor, and the second active element is electrically connected to the photosensor through the first connecting electrode;

a wavelength conversion layer disposed in the sixth opening of the second light-impermeable layer; and a conducting layer comprising:
  a first connecting pad disposed on a lower side of the light-emitting unit and electrically connected to the light-emitting unit, wherein at least a portion of the first connecting pad is disposed in the fourth opening, and the first active element is electrically connected to the light-emitting unit through the first connecting pad;
  a second connecting pad disposed on the lower side of the light-emitting unit and electrically connected to the light-emitting unit, wherein at least a portion of the second connecting pad is disposed in the fourth opening; and
  a second connecting electrode disposed on an upper side of the photosensor.

2. The electronic device of claim 1, further comprising:
a first color filter disposed in the first opening.

3. The electronic device of claim 2,
wherein the wavelength conversion layer is disposed between the first color filter and the light-emitting unit.

4. The electronic device of claim 1, wherein the width of the third opening of the second light-impermeable layer is less than the width of the second opening of the first light-impermeable layer, and a width of the fifth opening of the third light-impermeable layer is less than the width of the third opening of the second light-impermeable layer.

5. The electronic device of claim 1, wherein a width of the fifth opening is less than a width of the fourth opening.

6. The electronic device of claim 1, wherein the first substrate comprises a first side and a second side opposite to the first side, the first side is closer to the second substrate than the second side, and the photosensor is disposed on the first side.

7. The electronic device of claim 1, further comprising:
a second color filter disposed in the second opening.

8. The electronic device of claim 7, wherein the second color filter is a green color filter.

9. The electronic device of claim 1, wherein the photosensor is configured to sense a fingerprint.

10. The electronic device of claim 1, wherein the first light- impermeable layer comprises a photoresist material.

11. The electronic device of claim 1, comprising:
a first substrate structure;
a second substrate structure; and
a bonding layer disposed between the first substrate structure and the second substrate structure;
wherein the first substrate structure comprises the first substrate, the first active element, the second active element, the light-emitting unit and the photosensor, and the second substrate structure comprises the second substrate, the first light-impermeable layer and the second light-impermeable layer.

12. The electronic device of claim 1, wherein the width of the third opening of the second light-impermeable layer is less than the width of the second opening of the first light-impermeable layer.

13. The electronic device of claim 1, further comprising:
a first organic layer disposed on the third light-impermeable layer and disposed in the fifth opening of the third light-impermeable layer, wherein the third light-impermeable layer is disposed on the photosensor.

14. The electronic device of claim 1, comprising:
a first substrate structure;
a second substrate structure opposite to the first substrate structure;
wherein the first substrate structure comprises the first substrate, the first active element, the second active element, the light-emitting unit, the photosensor, the second light-impermeable layer, the third light-impermeable layer, and a second organic layer disposed between the second light-impermeable layer and the second substrate structure,
wherein the second substrate structure comprises the second substrate, the first light-impermeable layer, and a third organic layer disposed between the first light-impermeable layer and the first substrate structure; and
a bonding layer bonded between the second organic layer of the first substrate structure and the third organic layer of the second substrate structure.

15. The electronic device of claim 14, wherein the third organic layer is disposed in the second opening of the first light-impermeable layer.

* * * * *